(12) United States Patent
Hattori et al.

(10) Patent No.: US 11,295,960 B1
(45) Date of Patent: Apr. 5, 2022

(54) ETCHING METHOD

(71) Applicant: Hitachi High-Tech Corporation, Tokyo (JP)

(72) Inventors: Takashi Hattori, Tokyo (JP); Masaki Yamada, Tokyo (JP); Michael Walker, Hillsboro, OR (US); Catherine King, Hillsboro, OR (US); Hiroto Otake, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/195,913

(22) Filed: Mar. 9, 2021

(51) Int. Cl.
*H01L 21/311* (2006.01)

(52) U.S. Cl.
CPC .............. *H01L 21/31116* (2013.01)

(58) Field of Classification Search
None
See application file for complete search history.

(56) References Cited

U.S. PATENT DOCUMENTS

| | | | |
|---|---|---|---|
| 5,022,961 A | 6/1991 | Izumi et al. | |
| 5,571,375 A | 11/1996 | Izumi et al. | |
| 9,165,786 B1 * | 10/2015 | Purayath | H01L 29/66833 |
| 9,431,268 B2 | 8/2016 | Lill et al. | |
| 9,613,823 B2 | 4/2017 | Demichi et al. | |
| 10,319,603 B2 | 6/2019 | Chen et al. | |
| 2016/0020115 A1 | 1/2016 | Demichi et al. | |

FOREIGN PATENT DOCUMENTS

| | | |
|---|---|---|
| JP | H07153737 A | 6/1995 |
| JP | H07169738 A | 7/1995 |
| JP | 2005161493 A | 6/2005 |
| JP | 2013074200 A | 4/2013 |
| JP | 2016025195 A | 2/2016 |

* cited by examiner

*Primary Examiner* — Roberts P Culbert
(74) *Attorney, Agent, or Firm* — Miles & Stockbridge, P.C.

(57) ABSTRACT

A method of etching a silicon oxide film with high precision at high selectivity as compared with a silicon nitride film while establishing both of a higher etching rate of the silicon oxide film and a lower etching rate of the silicon nitride film is provided. An etching method according to the present invention is directed to a dry etching method for etching a film structure without using plasma in which an end of a film layer having a silicon oxide film vertically sandwiched between silicon nitride films and laminated and formed in advance on a wafer disposed in a processing chamber forms a side wall of a groove or a hole while a processing gas is supplied into the processing chamber, the method including the steps of: supplying a hydrogen fluoride gas; cooling the wafer to a low temperature of −30° C. or lower, preferably, to −30 to −60° C.; and etching the silicon oxide film laterally from the end.

15 Claims, 9 Drawing Sheets

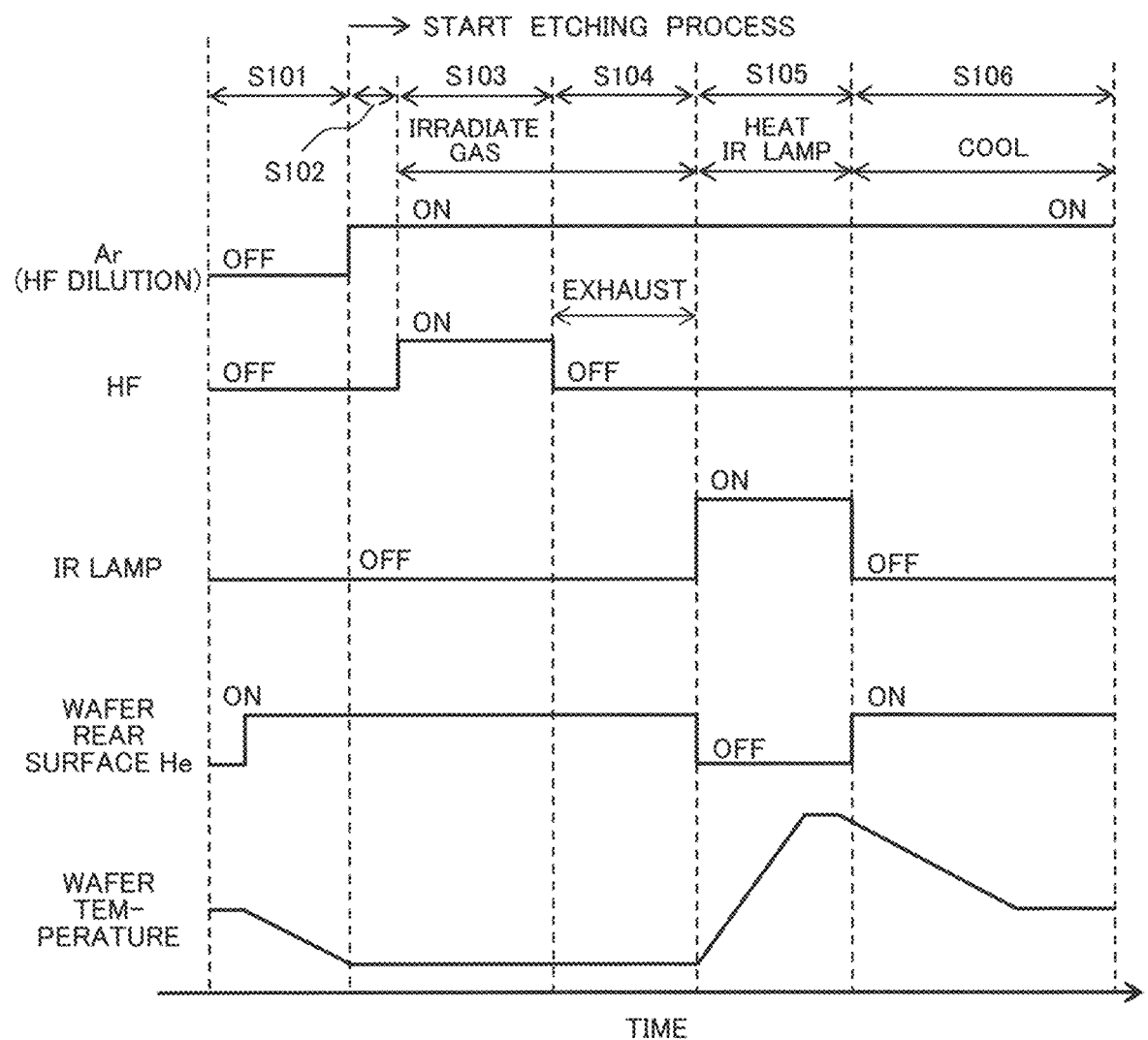

ETCHING METHOD

BACKGROUND OF THE INVENTION

The present invention relates to an etching method for processing a film layer to be processed, which has a film structure including multiple film layers previously formed on a surface of a substrate-shaped sample such as a semiconductor wafer disposed in a processing chamber as a process for manufacturing a semiconductor device. In particular, the present invention relates to an etching method for supplying gas particles into a processing chamber to etch and remove a silicon oxide film in a case where a silicon oxide film to be processed and a silicon nitride film are laminated as the film structure on a top surface of the sample.

In semiconductor devices, in order to respond to a request for a reduction in power consumption and an increase in a memory capacity, further miniaturization and a three-dimensional device structure have been advanced. In the manufacture of the devices with a three-dimensional structure, the structure is three-dimensional and complicated, as a result of which, in addition to the conventional "vertical (anisotropic) etching" in which etching is performed in a direction perpendicular to a wafer surface, "isotropic etching" in which etching is enabled even in a lateral direction has been widely used. Conventionally, isotropic etching has been performed by wet treatment using a chemical solution, but with the progress of miniaturization, problems such as pattern collapse due to a surface tension of the chemical solution and etching residue in fine gaps have become noticeable. In addition, there is a problem that a large amount of chemical solution is required to be treated. For that reason, in the isotropic etching, there is a need to replace the conventional wet treatment using a chemical solution with a dry treatment using no chemical solution.

Since silicon oxide films are often used in the semiconductor devices, there are many known examples of the dry etching process. For example, Japanese Patent Application Laid-Open No. Hei 07-169738 discloses a technique for etching a silicon oxide-based material layer with an alcohol and a CF-based gas at 0° C. or lower with using plasma. Further, Japanese Patent Application Laid-Open No. 2013-074200 discloses that a mixed gas of hydrogen fluoride and methanol is used to remove deposits by etching at 30° C. or lower without using plasma.

Meanwhile, in the process of manufacturing the semiconductor device, a technique is required for etching an oxide film with high selectivity and isotropically with respect to polycrystalline silicon films and silicon nitride films under the control at an atomic layer level in the laminated film processing of a 3D-NAND flash memory, which is a semiconductor device of the three-dimensional structure and the processing around a gate of a Fin FET. In particular, in the 3D-NAND structure, the silicon oxide film is required to be etched by a small amount in the lateral direction selectively and isotropically from a structure in which a large number of silicon oxide films ($SiO_2$ film) and silicon nitride films (SiN) are alternately laminated on each other, and deep hole or groove shapes are provided in the laminated films.

To cope with the above problem, Japanese Patent Application Laid-Open No. 2016-025195, U.S. Ser. No. 09/613,823B, Japanese Patent Application Laid-Open No. Hei 07-153737, and U.S. Ser. No. 05/571,375B disclose that a silicon oxide film is etched with hydrogen fluoride and alcohol at a temperature such as 0 to 30° C. or room temperature to 40° C. without using plasma. Further, the abovementioned Japanese Patent Application Laid-Open No. 2016-025195, U.S. Ser. No. 09/613,823B, and Japanese Patent Application Laid-Open No. Hei 07-153737 have a disclosure regarding silicon nitride.

Furthermore, Japanese Patent Application Laid-Open No. 2005-161493 discloses a technique for etching a structure having a silicon oxide film formed on a silicon nitride film by $HF_2^-$ generated from hydrogen fluoride and alcohol without using plasma, and thereafter heating the structure and further cooling the structure. Further, U.S. Ser. No. 10/319,603B discloses a technique for etching a silicon nitride film selectively in the lateral direction from a structure in which the silicon nitride film and a silicon oxide film are laminated on each other with using a precursor containing oxygen and a precursor containing fluorine at −20° C. or lower.

Further, U.S. Ser. No. 09/431,268B discloses a technique in which, in a method of adsorbing an OH-containing species on a surface of a silicon oxide film to activate the species and then etching the silicon oxide film with anhydrous HF, water produced by the reaction is removed from the surface of the substrate by heating.

SUMMARY OF THE INVENTION

However, in the abovementioned prior art, problems have arisen because the following matters have not been sufficiently considered.

That is, as described in the background art, the conventional wet etching with the hydrofluoric acid solution and the buffered hydrofluoric acid solution have the problem of the etching residue in the fine gaps and the problem of the poor controllability of the etching. On the other hand, the dry etching suffers from a problem that it is difficult to establish both of a higher etching rate of the silicon oxide film and a lower etching rate of the silicon nitride film, and it is difficult to etch the silicon oxide film at high selectivity as compared with the silicon nitride film.

For that reason, in the conventional technique, in a step of etching the silicon oxide film in the film structure in which the film layer of silicon oxide and the film layer of silicon nitride are laminated on each other in the vertical direction, the processing accuracy is low and a desired film structure shape after processing cannot be obtained, and the yield of the processing is impaired. The above problem has not been sufficiently considered.

The present invention has been made in view of the above problems, and an object of the present invention is to provide a method of etching a silicon oxide film with high precision at high selectivity as compared with a silicon nitride film while establishing both of a higher etching rate of the silicon oxide film and a lower etching rate of the silicon nitride film.

An etching method according to the present invention is directed to a dry etching method for etching a film structure without using plasma in which an end of a film layer having a silicon oxide film vertically sandwiched between silicon nitride films and laminated and formed in advance on a wafer disposed in a processing chamber forms a side wall of a groove or a hole while a processing gas is supplied into the processing chamber, the method including the steps of: supplying a hydrogen fluoride gas; cooling the wafer to a low temperature of −30° C. or lower, preferably, to −30 to −60° C.; and etching the silicon oxide film laterally from the end.

Both etching of the silicon oxide film at a higher etching rate and etching of the silicon nitride film at a lower etching rate can be established, as a result of which, the silicon oxide film can be removed by etching with high precision at high selectivity as compared with the silicon nitride film.

BRIEF DESCRIPTION OF THE DRAWINGS

FIG. 6 is a time chart showing an operation flow when the etching processing apparatus according to the example shown in FIG. 1 performs the etching process according to the modification shown in FIG. 5;

DETAILED DESCRIPTION OF THE PREFERRED EMBODIMENTS

Figure 1:
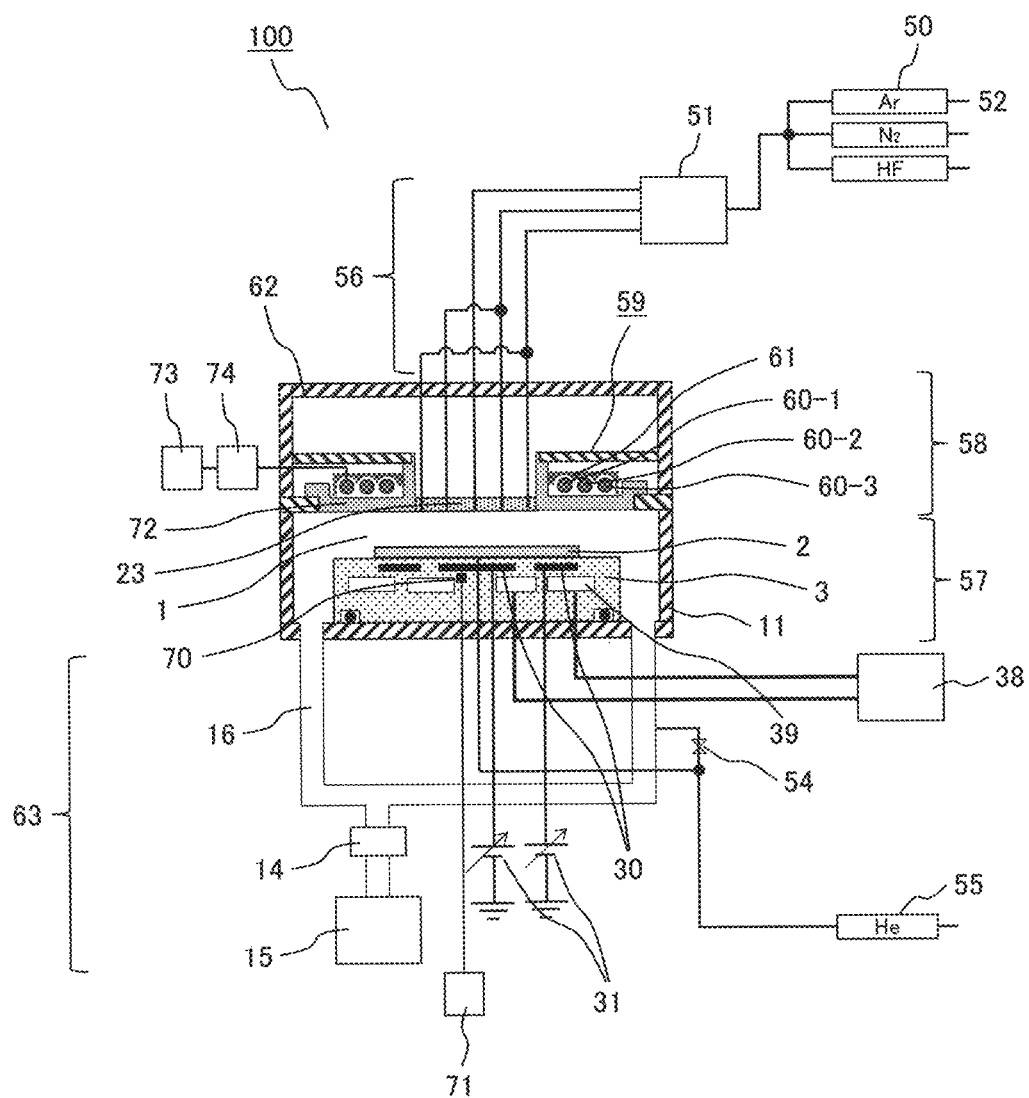
FIG. 1 is a vertical cross-sectional view schematically showing a whole structure of an etching processing apparatus according to an example of the present invention.

The present inventors have studied that each single layer film of a silicon oxide film ($SiO_2$ film) and a silicon nitride film (SiN) formed on a wafer surface by CVD (chemical vapor deposition) using plasma is etched without using plasma. More specifically, the present inventors have studied the details of etching the single layer film when a hydrogen fluoride (HF) gas is supplied alone or in a mixture with an inert gas such as argon Ar to the processing chamber in which the wafer is disposed. As a result, as will be described later with reference to FIGS. 7A and 7B, the present inventors have found out that under the condition of a pressure of 300 Pa during etching, when a set temperature of a chiller for adjusting a temperature of a circulating refrigerant for cooling a stage on which the wafer is held is set to a value higher than −30° C., the silicon oxide film and the silicon nitride film are not etched at all, whereas when the temperature is −30° C. or lower, especially −50° C. or higher, the etching rate of the silicon oxide film is rapidly increased and becomes 20 nm/min or more.

On the other hand, it has been found that the etching rate of the silicon nitride film remains small at 1 nm/min or less and does not change even at a low temperature of −30° C. or less. Furthermore, it has been found that in a temperature range lower than −40° C., the etching rate of the silicon oxide film gradually decreased as the temperature decreased. As a result, it has been found that the selectivity of the etching rate of the silicon oxide film to the silicon nitride film is relatively higher in a range of −35° C. to −55° C. than the selectivity outside of that range.

By the way, it has been generally known that the silicon oxide film is etched when the hydrogen fluoride gas and alcohol or water gas are used in combination. The reaction formulae of the silicon oxide film at this time are expressed below, as disclosed in Patent Literature 7.

$$2HF + MOH \rightarrow HF_2^- + MOH_2^+ \quad (Ex. 1)$$

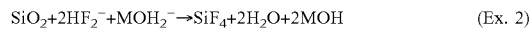

$$SiO_2 + 2HF_2^- + MOH_2^- \rightarrow SiF_4 + 2H_2O + 2MOH \quad (Ex. 2)$$

where M represents an atom or molecule such as H, $CH_3$, and $CH_2CH_3$.

For example, hydrogen fluoride gas and methanol (methyl alcohol) are used, two molecules of hydrogen fluoride (HF) react with methanol ($CH_3OH$) to generate $HF_2^-$, which are active species, in accordance with Expression 1. $HF_2^-$ reacts with $SiO_2$ to generate $SiF_4$ (boiling point −94.8° C.), and the $SiF_4$ volatilizes and etching occurs. In the reaction represented by the above Expression 2, $HF_2^-$ is responsible for the reaction while methanol functions to extract $H^+$ from two molecules of hydrogen fluoride to generate $HF_2^-$.

On the other hand, in the etching of the silicon oxide film without using plasma while the hydrogen fluoride gas is supplied alone or in mixture with an inert gas such as Ar, which has been found by the present inventors, no alcohol or water is supplied into the processing chamber from the outside of the processing chamber. However, since the etching rate of the silicon oxide film is high to some extent, it is considered that $HF_2^-$ becomes active species and the silicon oxide film is etched. The present inventors have considered that the occurrence of $HF_2^-$ under the condition where alcohol or moisture is not supplied from the outside of the processing chamber is caused by a small amount of moisture ($H_2O$) existing on the surface of the silicon oxide film.

As represented in the above Expression 1, in order to generate $HF_2^-$ which is active species of reaction, MOH, in this example, water ($H_2O$) at which M=H is required. However, as represented in the above Expression 2, water is also a reaction product, and it is considered necessary to remove water in order to promote the reaction. When water is excessively present, as disclosed in U.S. Ser. No. 09/431, 268B, the reaction represented by the following Expression 3 occurs to regenerate $SiO_2$, which is silicon oxide, and hexafluorosilicic acid $H_2SiF_6$ is produced.

$$3SiF_4 + 2H_2O \rightarrow SiO_2 + 2H_2SiF_6 \quad (Ex. 3)$$

For that reason, in order to inhibit $SiO_2$ of silicon oxide from being generated, there is a need to quickly remove water. The present invention utilizes that the etching rate of the silicon oxide film rapidly increases at a low temperature of −30° C. or lower.

That is, −35° C. is a melting point of a hydrofluoric acid aqueous solution having a concentration of 50% close to that of a saturated solution. From the above fact, the present inventors have considered that the water generated by the reaction on the surface of the silicon oxide film mixes with the supplied hydrogen fluoride gas to form hydrofluoric acid, which is close to a saturated solution, and becomes a solid, as a result of which water is removed from the surface of the silicon oxide film, and an etching reaction occurs. On the other hand, it is considered that in the case of a high temperature higher than −30° C., hydrofluoric acid remains liquid and water is not removed, and the reaction of forming a silicon oxide represented by Expression 3 occurs, and the etching is not advanced.

If, for example, heating from the outside is performed to completely remove the water generated in the reaction, the reaction of producing the active species $HF_2^-$ (Ex. 1) does not occur, so that the etching does not continuously progress. On the other hand, as described above, the temperature of −35° C. is a temperature at which hydrofluoric acid becomes solid on the surface of the silicon oxide, and in a state where the water is continuously present on the silicon oxide surface to some extent and becomes solid, water is removed and etching occurs. In the present embodiment, the solidification of the water does not cause the reaction of (Ex. 3), excludes from linkage of he the reaction related to etching, and promotes the etching of the silicon oxide film.

As described above, according to the present embodiment, establishing both of a higher etching rate of the silicon oxide film and a lower etching rate of the silicon nitride film on the wafer surface can be established by supplying the hydrogen fluoride gas alone or in mixture with an inert gas such as Ar in a state where the temperature of the wafer is maintained at −30° C. or lower and −60° C., or higher, preferably, −35 to −50° C., and the silicon oxide film can be etched with high precision at high selectivity as compared with the silicon nitride film.

Hereinafter, embodiments of the present invention will be described in detail with reference to the accompanying drawings.

First Embodiment

[Etching Processing Apparatus]

The configuration of an etching processing apparatus 100 according to an example of the present invention will be described with reference to FIG. 1. FIG. 1 is a vertical cross-sectional view schematically showing the entire configuration of the etching processing apparatus according to the example of the present invention.

In the figure, the etching processing apparatus 100 includes a lower unit 57 having a base chamber 11 which is a cylindrical metal vacuum container having a central axis in a vertical direction and an upper unit 58 that is mounted above the base chamber 11 and configures a circular ceiling surface of the base chamber 11. Further, a vacuum exhaust unit 63 including an exhaust pump that exhausts an inside of the base chamber 11 to reduce a pressure is disposed below the base chamber 11.

A processing chamber 1 that is a space surrounded by a side wall and a bottom of the base chamber 11 and whose inside is reduced in pressure is disposed inside the base chamber 11. A wafer stage 3 which is a cylindrical support base on a top surface of which a wafer 2 is mounted is disposed inside the cylindrical processing chamber 1. At least one through hole that communicates with the inside and outside of the processing chamber 1 is provided in a bottom of the base chamber 11 on an outer peripheral side of the wafer stage 3, and an opening of the through hole configures an exhaust port through which a discharges gas and particles inside the processing chamber 1 are discharged.

Further, a shower plate 23 which is a disk made of a dielectric material such as quartz is formed above a top surface of the wafer stage 3 at a center of a ceiling surface of the processing chamber 1 across a space into which a gas for processing the film layer on the surface of the wafer 2 is introduced so as to face the top surface of the wafer stage 3, and configures a top surface of the processing chamber 1 as the upper unit 58. The shower plate 23 is provided with multiple through holes, and the processing gas is supplied into the processing chamber 1 through the through holes. The processing gas of the present embodiment is a mixed gas containing multiple types of elements including at least one type of reactive gas that reacts with the film layer to be processed disposed in advance on the surface of the wafer 2 and a rare gas that dilutes the reactive gas at a predetermined ratio.

The flow rate or speed of the processing gas is adjusted for each gas type by mass flow controllers 50 disposed for each gas type on a processing gas supply pipeline disposed so as to communicate with the through hole of the shower plate 23, and multiple gas pipes are combined into one, and the gases merge and are supplied as the processing gas to the through hole of the shower plate 23. Further, a gas distributor 51 is disposed at a further downstream side of the processing gas supply pipeline merged on a downstream side of the mass flow controller 50, and multiple gas supply pipes 56, which are gas supply pipelines, are connected between the gas distributor 51 and the shower plate 23, and lower ends of those pipelines are disposed so as to communicate with the through holes provided in the central portion or the outer peripheral portion of the shower plate 23.

In the present embodiment, the processing gases passing through the gas supply pipes 56 communicating with the through holes of the shower plate 23 and adjusted in flow rate and composition independently in the central portion and the outer peripheral portion are supplied into the processing chamber 1 from the upper central portion, and a distribution of the partial pressure of the processing gas is adjusted to a desired value in each of a region close to the center and a region close to the outer periphery of the processing chamber 1. In the example of FIG. 1, Ar, $N_2$, and HF are described as elements that are raw materials for the processing gas, but a processing gas of other types may also be supplied.

Further, in the present embodiment, a gas obtained by vaporizing a liquid raw material as the processing gas may be supplied into the processing chamber 1 through the through holes of the shower plate 23. For example, liquid HF or a material containing the liquid HF may be used as a raw material, and a gas obtained by vaporizing the liquid of the raw materials accumulated in a reservoir in a vapor supply unit (not shown) may be used as the processing gas.

While the processing gas formed of the vapor of the raw material is not introduced into the processing chamber 1, one valve on the pipeline connecting the gas distributor 51 and the reservoir is closed to block between the liquid raw material and the processing chamber 1. It is desirable to dispose a heater on the pipe through which a steam of the raw material flows and to heat the inside of the pipe by receiving the heat from the heater so that the steam of the raw material does not condense inside the pipe.

An exhaust device 15 having an exhaust pump for exhausting the inside of the processing chamber 1 to reduce the pressure communicates with a lower portion of the wafer stage 3 in the lower part of the processing chamber 1 in the base chamber 11 through a vacuum exhaust pipe 16. It is assumed that the exhaust device 15 is provided with an exhaust pump capable of reducing the pressure inside the processing chamber 1 to a predetermined degree of vacuum, such as a turbo molecular pump, a mechanical booster pump, or a dry pump. Further, in order to adjust the pressure inside the processing chamber 1, a pressure control valve 14 is disposed on the vacuum exhaust pipe 16 that connects and communicates between the exhaust port that communicates the bottom member of the base chamber 11 and the exhaust device 15. The pressure control valve 14 has at least one plate-shaped flap positioned to across a flow path through an exhaust gas in the vacuum exhaust pipe 16 flows in a lateral direction, and the flap is rotated or moved in a direction crossing the flow path to increase or decrease a flow path cross-sectional area, thereby increasing or decreasing the flow rate or speed of the exhaust gas flowing inside.

The base chamber 11 and the cylindrical upper unit 58 above the base chamber 11 are attached to each other in such a manner that in a state where the upper unit 58 is attached, an outer peripheral end of a bottom surface of the cylindrical upper unit 58 is placed above a cylindrical side wall upper end of the base chamber 11 through a seal member such as an O-ring so that the inside and outside of the processing chamber 1 are hermetically sealed. The shower plate 23 is disposed at the central portion of the bottom of the upper unit 58. Further, an IR lamp unit 59 having a ring shape is disposed in an outer peripheral region of the shower plate 23, and an IR light transmission window 72 of the IR lamp unit 59 configures a lower surface of the upper unit 58, that is, a top surface of the processing chamber 1. Further, the upper unit 58 includes a metal cylindrical upper unit cover 62 that surrounds the IR lamp unit 59, the upper portion of the shower plate 23 disposed at the central portion of the IR lamp unit 59, and the circumference of the gas supply pipe 56 connected to the upper part of the shower plate 23.

In this example, the IR lamp unit 59 is disposed above the outer circumferential region of the top surface of the wafer stage 3 so as to surround the top surface of the wafer stage 3 and the wafer 2 mounted on the top surface in a ring shape. The IR lamp unit 59 includes a ring-shaped lamp 60 that emits electromagnetic waves having multiple wavelengths including an infrared light wavelength range such as a halogen lamp, and the wafer 2 is irradiated from the circumstance with the electromagnetic waves emitted into the processing chamber 1 from the lamp 60 through the transmission window 72. The emitted electromagnetic waves in this example are assumed to emit electromagnetic waves (referred to as IR light in this example) containing many electromagnetic waves in the wavelength range from a visible light to an infrared light.

The IR lamp unit 59 includes the lamp 60 disposed in a triple ring shape around the shower plate 23, a ring-shaped reflective plate 61 that covers the lamp 60 above the lamp 60 and reflects the emitted IR light toward a center side and a bottom (direction of the mounted wafer 2) of the processing chamber 1, and the IR light transmission window 72 that is disposed below the lamp 60, made of a dielectric ring member such as quartz through which the IR light passes, and surrounds the shower plate 23. The IR lamp 60 in this example includes multiple circle-shaped (circular) lamps 60-1, 60-2, and 60-3 which are concentrically arranged around the center of the shower plate 23 or the processing chamber 1 in the vertical direction when viewed from above. Those plural lamps may be replaced with one lamp arranged in a spiral shape. Further, in the present embodiment, it is assumed that the lamps for three laps are installed, but two laps, four laps, or the like may be used.

The lamp 60 is connected to a lamp power supply 73 that supplies power, and a high frequency cut filter 74 is disposed on a power feed path for electrically connecting the lamp 60 and the lamp power supply 73 for reducing noise of high-frequency power to prevent the noise from flowing into the lamp power supply 73. Further, the lamp power supply 73 has a function of independently controlling the electric power supplied to each of the lamps 60-1, 60-2, and 60-3.

The IR lamp unit 59 that surrounds the shower plate 23 in a ring shape includes a top surface portion of the IR light transmission window 72 facing the ring-shaped processing chamber 1 and a cylindrical inner peripheral side wall portion that is connected above an inner peripheral end of the top surface portion, and surrounds the shower plate 23 and the gas supply pipes 56 connected to the through holes on a back surface side of the shower plate 23. As with the top surface portion, the cylindrical inner peripheral side wall portion is made of a dielectric member through which the IR light passes, and the emitted IR light is irradiated to the shower plate 23 through the cylindrical portion, and is also emitted into the processing chamber 1 through the shower plate 23.

A flow path 39 is disposed inside the disk-like or cylindrical metal member of the wafer stage 3, and a refrigerant for cooling the wafer stage 3 to adjust the temperature of the wafer stage 3 flows inside the flow path 39. The refrigerant those temperature has been adjusted to a value within a predetermined range is supplied to a chiller 38 connected to an inlet and outlet of the flow path 39 and circulates. The chiller 38 in the present embodiment is used to adjust a temperature of the refrigerant or the metal member to a range of at least −30° C. to −60° C., preferably, −35° C. to −50° C. Further, a dielectric film forming a top surface on which the wafer 2 is placed is disposed on tan top surface of the metal member, and multiple plate-like electrode plates 30 are integrated into the dielectric film, and DC power for fixing the wafer 2 by electrostatic adsorption is supplied to the electrode plates 30. Each of DC power supplies 31 is connected to a corresponding electrode plate 30.

Further, in order to efficiently adjust the temperature of the wafer 2, a supply port for supplying a helium (He) gas 55 is disposed on the top surface of the dielectric film of the wafer stage 3, and the helium gas 55 is supplied between the rear surface of the waver 2 and the dielectric film in a state where the wafer 2 is mounted so as to promote heat transfer between the wafer 2 and the flow path 39. Further, the dielectric film is made of a resin such as polyimide in order to prevent the back surface of the wafer 2 from being scratched even when the wafer 2 is heated or cooled while being adsorbed by static electricity.

Further, a thermocouple 70 as a temperature detector (sensor) for detecting the temperature of the wafer stage 3 or the metal member is disposed inside the metal member of the wafer stage 3, and connected to a thermocouple thermometer 71. An output from the thermocouple thermometer 71 is transmitted to a control unit that controls the operation of the etching processing device 100 (not shown). An arithmetic unit in the control unit detects a value of the temperature based on an algorithm described in predetermined software stored in a storage device, and transmits to the lamp power supply 73 a command signal for independently adjusting an output of the IR light of each of the lamps 60-1, 60-2, and 60-3 so as to obtain a desired temperature distribution of the wafer 2 according to a difference between the detected values and an intended temperature distribution of the wafer 2 in a radial direction, which is obtained from the detected values.

In the etching processing apparatus 100 of the present embodiment, as a mechanism for cooling the wafer stage 3, in addition to the mechanism in which the refrigerant is circulated by the flow path 39 through which the refrigerant circulates inside, a Peltier element or the like, which is a thermoelectric conversion device that forms a temperature difference according to electric power supplied to the inside of the wafer stage 3 can also be used. Also, an inner wall other than the wafer stage 3 in the processing chamber 1 exposed to the processing gas such as hydrogen fluoride gas and methanol gas can be heated to a temperature in a range of 40° C. to 120° C., for example. As a result, hydrogen fluoride gas and methanol gas can be inhibited from adsorbing onto the surface of the inner member of the processing chamber 1, and corrosion inside the member can be reduced.

A stage temperature of the wafer stage 3 is a difference within ±1° C. with respect to a set temperature of the chiller 38 by the thermocouple thermometer 71 using the thermocouple 70, and the temperature of the wafer 2 separately measured by the thermocouple 70 is a difference within ±3° C. (within ±2° C. with respect to the stage temperature of the wafer stage 3).

Further, the etching processing apparatus 100 used in the present invention can heat the inside of the base chamber 11 other than the wafer stage 3 exposed to hydrogen fluoride gas such as the processing chamber 1. For example, as the temperature, about 40° C. to 120° C. can be used. As a result, hydrogen fluoride gas or the like can be prevented from being adsorbed inside the base chamber 11, and corrosion inside the base chamber 11 can be reduced as much as possible.

[Etching Process Flow]

Figure 2:
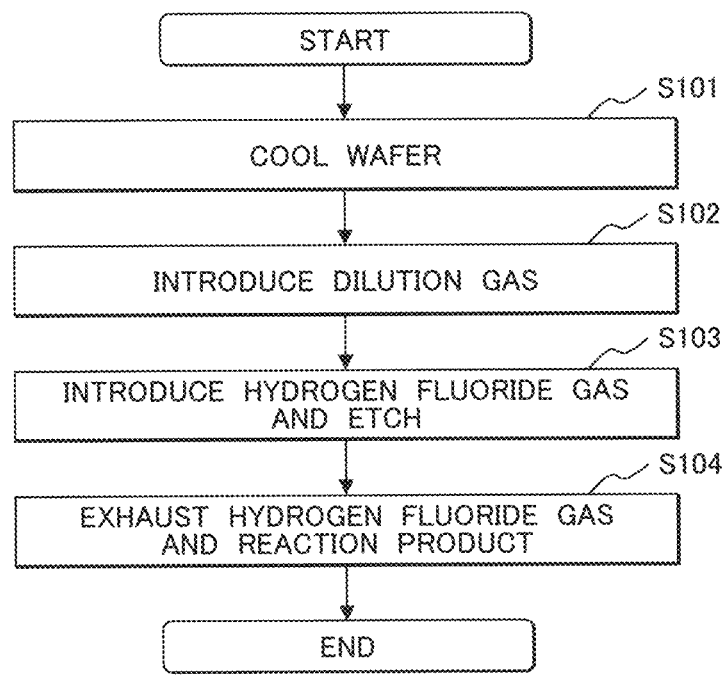
FIG. 2 is a flowchart showing an example of a flow of an etching process performed by the etching processing apparatus according to the example shown in FIG. 1.
Figure 3A:
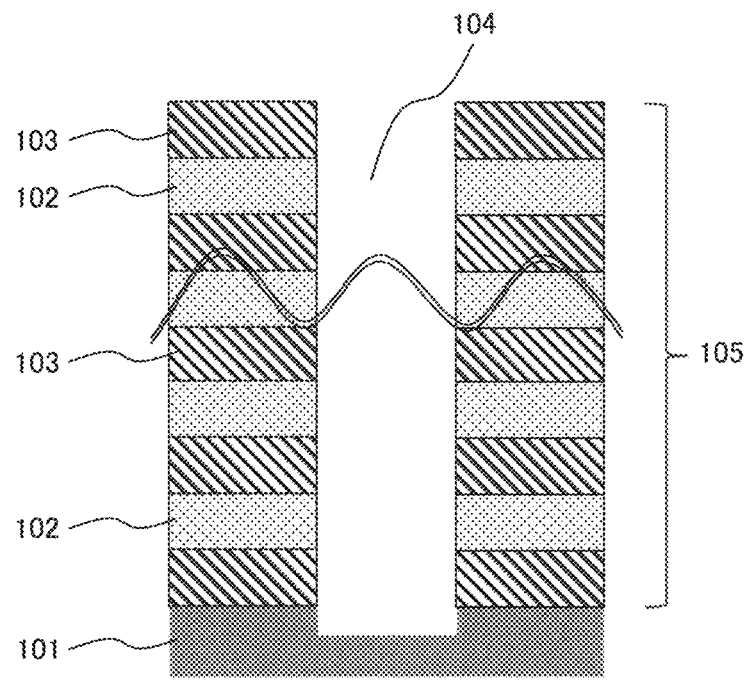
FIGS. 3A and 3B are vertical cross-sectional views schematically showing an example of a film structure on a wafer which is subjected to the etching process shown in FIG. 2.
Figure 3B:
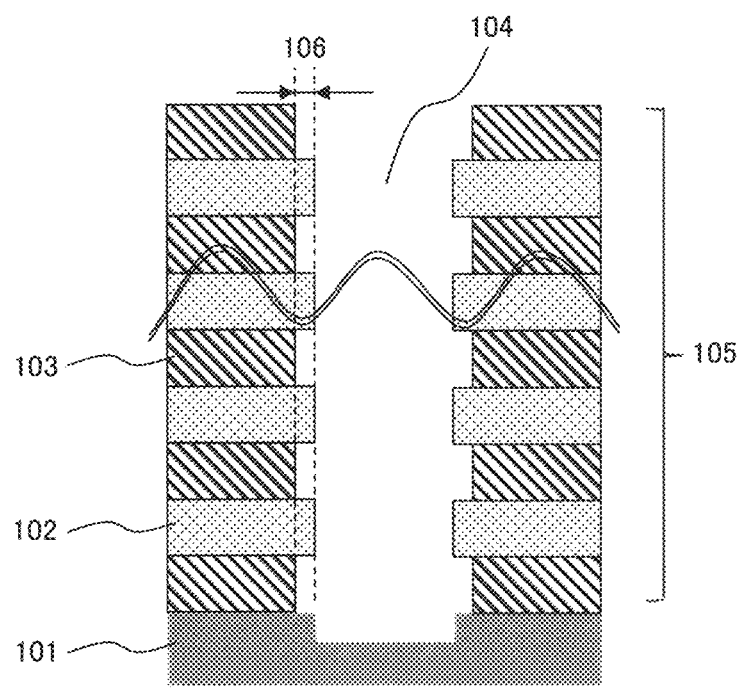
Figure 4:
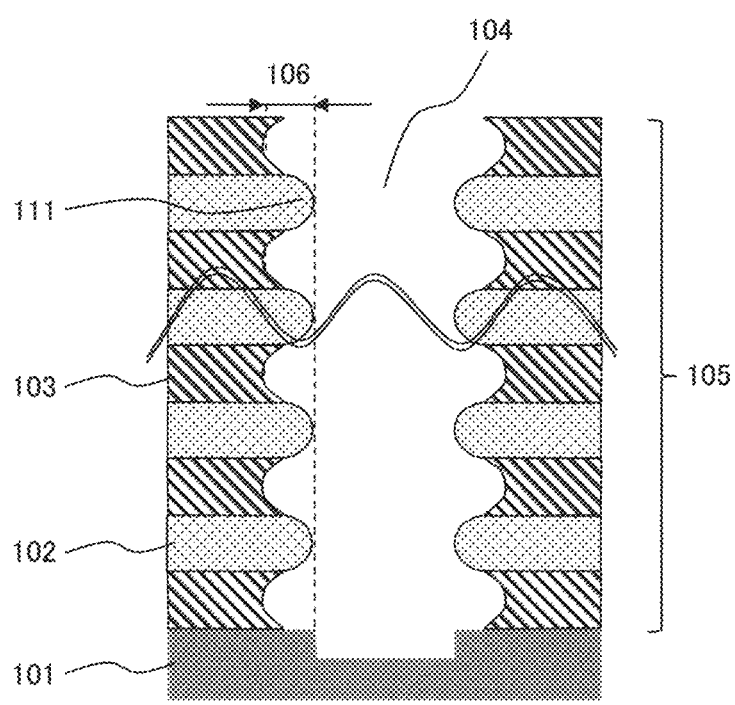
FIG. 4 is a vertical cross-sectional view schematically showing an example of a shape after processing when selectivity is low in the etching process for a film structure on the wafer shown in FIG. 3.

Next, steps of etching the wafer 2 performed by the etching processing apparatus 100 according to the present embodiment shown in FIG. 1 will be described with reference to FIGS. 2, 3 and 4. FIG. 2 is a flowchart showing an example of a flow of the etching process performed by the etching processing apparatus according to the present embodiment shown in FIG. 2.

In the example of FIG. 2, first, the wafer 2 placed on a distal end of a wafer transfer machine such as a robot arm provided in an internal pressure reduced space, which is another vacuum container (not shown) disposed adjacent to the base chamber 11 is carried in above the wafer stage 3 in the processing chamber 1 through a gate (not shown) that is disposed on the side wall portion of the base chamber 11 which surrounds the processing chamber 1 in a horizontal direction and is a transfer port for carrying in and out the wafer 2 between the inside and outside of the processing chamber 1, and then transferred to three or more pin tips projecting above the top surface of the wafer stage 3. After the robot arm exits the processing chamber 1, and the gate is airtightly closed, the wafer 2 is placed on the top surface of the wafer stage 3 due to drop and storage of the pins into the wafer stage 3. The powers from electrostatic adsorption DC power supplies 31 are supplied the respective electrostatic adsorption electrodes 30 disposed in the dielectric film made of ceramic such as alumina or yttria which configures the top surface of the wafer stage 3 so that the wafer 2 is adsorbed and held on the top surface of the dielectric film.

Thereafter, a heat conducting gas such as He gas 55 is supplied to a gap between the back surface of the wafer 2 and the dielectric film to promote heat transfer between the wafer stage 3 and the wafer 2. As a result, the temperature of the wafer 2 gradually approaches the temperature of the wafer stage 3 which is close to the temperature of the refrigerant flowing through the flow path 39, and a wafer cooling step shown in Step S101 of FIG. 2 is performed. In the etching process of the silicon oxide film formed in advance on the top surface of the wafer 2 in this example, the temperature of the wafer 2 is maintained in a range of −30° C. to −60° C., preferably −35° C. to −50° C. The refrigerant flowing through the flow path 39 is lower than the temperature of the wafer 2 during the etching process, for example, set to the temperature of a value of −40° C. or lower, and is supplied to the flow path 39 for circulation.

Next, in Step S102, the Ar gas 52 for diluting the HF gas is supplied from above to the inside of the processing chamber 1 through the mass flow controller 50, the gas distributor 51, and the shower plate 23. In this example, the started supply of the Ar gas 52 for dilution may be continued until an end point of the process of etching the silicon nitride film to be processed on the top surface of the wafer 2 is determined, and the stop or the supply and stop may be repeated (intermittently) multiple times on the way. Also, the Ar gas 52 as the gas for dilution may be replaced with other inert gas, for example, nitrogen $N_2$.

Next, in Step S103, in a state where the wafer 2 is held on the top surface of the wafer stage 3, and the temperature of the wafer 2 is maintained in the range of −30° C. to −60° C., preferably, −35° C. to −50° C., the HF gas is supplied to the processing chamber 1 at a predetermined flow rate for a predetermined time. The supplied HF gas reaches the surface of the silicon oxide film on the surface of the wafer 2 and reacts with silicon oxide to remove silicon oxide and perform etching.

In the present embodiment, an inert gas such as Ar or $N_2$ can be used as the dilution gas. Since the etching rate tends to decrease more as the addition amount of dilution gas is larger, the etching rate can be controlled according to the addition amount of dilution gas.

In the present embodiment, the pressure in the processing chamber 1 in Step S103 is preferably a value in the range of 10 Pa to 2000 Pa, more preferably a value between 100 Pa and 1000 Pa. As will be described later, the higher the pressure, the higher the etching rate of the silicon oxide film and the slightly higher the temperature at which etching occurs. On the other hand, when the pressure is increased, as will be described later, the etching rate of the silicon nitride film tends to increase slightly, and the selectivity does not improve significantly.

After the supply of the HF gas in Step S103 has been performed for a predetermined time, the supply of the HF gas into the processing chamber 1 is stopped by the operation of a flow regulator of the gas distributor 51 (Step S104). Even during Step S104, an opening degree of the pressure control valve 14 and a rotation speed of the exhaust pump of the exhaust device 15 are adjusted in the same manner as those in Step S103, and the supply of the HF gas into the processing chamber 1 is stopped so that the HF gas remaining in a gas phase in the processing chamber 1 is discharged to the outside of the processing chamber 1 together with the reactive organisms or particles of other gases formed in the processing chamber 1 through the exhaust port and the vacuum exhaust pipe 16, and the pressure inside the processing chamber 1 is reduced. Subsequently, the supply of the He gas 55 supplied between the wafer 2 and the wafer stage 3 is stopped. At the same time, the valve 54 opens, and the pressure of the back surface of the wafer 2 is set to the same level as the pressure in the processing chamber 1 (that is, the He gas 55 of the back surface of the wafer 2 is removed).

A step of post-processing of the wafer 2 may be performed following the Step S104.

An example of the structure of the film targeted by the present embodiment will be described with reference to FIGS. 3A and 3B. FIGS. 3A and 3B are vertical cross-sectional views schematically showing an example of the film structure on the wafer on which the etching process shown in FIG. 2 is carried out.

As shown FIG. 3A, a film structure in which multiple silicon oxide films ($SiO_2$ films) 103 and multiple silicon nitride films ($Si_xN_y$, SiN films) 102 are alternately laminated on each other in the vertical direction, and a hole or groove shape passing through the multiple film layers is provided in the vertical direction (depth direction) is disposed on the silicon substrate 101 of the wafer 2. In such a film structure, the hole or groove has an opening 104 on the surface of the uppermost film layer (silicon oxide film 103 in this figure), which is a structure required for 3D-NAND.

In the above film structure, tens to hundreds of layers are laminated on each other. Since the thickness of the silicon oxide film 103 in this example is several nm to 100 nm, and the film thickness of the silicon nitride film 102 is several nm to several tens of nm, the overall film structure thickness 105 is several nm to several tens of nm. Further, a width of the opening 104 is several tens of nm to several hundreds of nm.

With use of the etching process shown in FIG. 2, as shown in FIG. 3B, the end surfaces of the silicon oxide films 103 configuring the side wall surfaces of the hole or groove act with the HF gas entering the hole or groove through the opening 104, and are etched at high selectivity as compared with the silicon nitride films 102 above and below the silicon oxide films 103. The end surfaces of the silicon oxide films 103 whose end surfaces have been etched and removed again react with the supplied HF gas and removed. As a result, the etching of the silicon oxide films 103 progresses in the lateral direction (right and left direction in the figure) whereas the positions of the end surfaces of the silicon nitride films 102 between which each silicon oxide film 103 is sandwiched do not change significantly. A dimension 106 of the etching in the lateral direction in this example is several nm to several tens of nm, and about 10 nm is optimal.

When etching the silicon oxide films 103 in the lateral direction, the selectivity with respect to the silicon nitride films 102 is preferably 15 or more, particularly 20 or more. When the selectivity is low, the etching of the silicon nitride films 102 progresses in parallel with the etching of the silicon oxide films 103. In such a case, as shown in FIG. 4, the shape of the end of the silicon nitride film 102 after etching is rounded and not rectangular, which may adversely affect the performance of the semiconductor device having the film structure shaped as described above. FIG. 4 is a vertical cross-sectional view schematically showing an example of the shape after processing when the selectivity is low in the etching process for the film structure on the wafer shown in FIGS. 3A and 3B.

According to the experiences of the present inventors, the selectivity of the etching process in this example for the film structure in which the silicon oxide films 103 and the silicon nitride films 102 shown in FIG. 3A are laminated on each other is 15 or more, more preferably 20. In the above case, a shape closer to a rectangle as shown in FIG. 3B can be obtained on the end surface of each film layer configuring the side wall surface of the groove or the hole. On the other hand, when the selectivity is less than 15, particularly 10 or less, the shape of the end of the silicon nitride film as shown in FIG. 4 becomes rounded, which is not desirable.

According to the study of the present inventors, as a result of etching the film structure shown in FIG. 3A in which the silicon oxide films 103 and the silicon nitride films 102 are alternately laminated on each other with a change in the temperature of the wafer 2, it has been found that etching hardly progresses at $-30°$ C. as expected, the etching amount is slightly small at $-55°$ C., and a shape shown in FIG. 3B is obtained by etching at $-35°$ C. to $-50°$ C. Further, as a result of performing heating after etching, it has been found that the roughness of the surface shape of the laminated film after processing due to residues such as residual dross or products is small.

Examples of the substrate 101 shown in FIGS. 3A and 3B include a substrate made of silicon and a substrate made of silicon germanium, they but are not limited to those materials. The silicon oxide films ($SiO_2$ films) 103 and the silicon nitride films (SiN films) 102 are alternately laminated and formed on each other. Those films may be formed by methods such as a plasma CVD, a chemical vapor deposition (CVD method), an atomic layer deposition method (ALD method), sputtering method, a precursor coating method, and a firing method.

When etching the film structure in which the ends of the film layers laminated by sandwiching the silicon oxide film 103 to be etched between the silicon nitride films 102 at the top and bottom configure the side walls of the groove and the hole, sediments and deposits may occur on the surfaces and ends of those films. Such sediments and deposits can be detached by irradiating the wafer 2 with electromagnetic waves such as infrared rays radiated from the lamp 60 included in the etching processing apparatus 100 shown in FIG. 1 to heat the film structure and thermally decomposing the sediments and the deposits. As a result, the surface of the film structure shown in FIGS. 3A and 3B can be more smoothened.

Incidentally, the heating of the wafer 2 is not limited to the use of the lamp 60. For example, the wafer 2 may be heated by heat transfer from the wafer stage 3 using a heater such as a heater disposed in the wafer stage 3, or the wafer 2 may be transported to the outside from the processing chamber 1 of the etching processing apparatus 100 shown in FIG. 1, and heated inside another heating device. Further, when the lamps 60-1, 60-2, and 60-3 irradiate electromagnetic waves, an inert gas such as Ar gas or $N_2$ gas may be introduced into the processing chamber 1.

During the etching process of the film structure in which the ends of the silicon nitride films 102 and the silicon oxide films 103 alternately laminated on each other in the vertical direction as described above form the side wall of the groove or the hole, the products generated during processing may adhere to or deposit on the surfaces of the silicon nitride films 102 or the surface of the side wall of the groove or hole. When the present inventors have analyzed such sediments and deposits by total reflection infrared absorption spectrum, it has been found that the sediments and deposits contain ammonium silicate.

According to the study by the present inventors, although ammonia is not used under the abovementioned processing conditions, it is assumed that ammonia may be produced from the nitrogen of the nitride film by etching a part of the silicon nitride film 102, and ammonium fluorosilicate $(NH_4)_2SiF_6$ may be produced. On the other hand, according to the information in a safety data sheet and the like, it has been known that ammonium fluorosilicate decomposes at 145° C.

The present inventors have obtained a finding that the produced deposits containing ammonium fluorosilicate can be removed by heating the film structure or the wafer 2 in the processing chamber 1 whose pressure is reduced to increase the temperature after the completion of the step of etching the silicon oxide film 103 while supplying the HF gas as described above. Therefore, a modification of the above example in which a step of removing the deposits by heating the wafer 2 as post-processing is added to a flow of the etching process shown in FIG. 2 will be described below.

Figure 5:
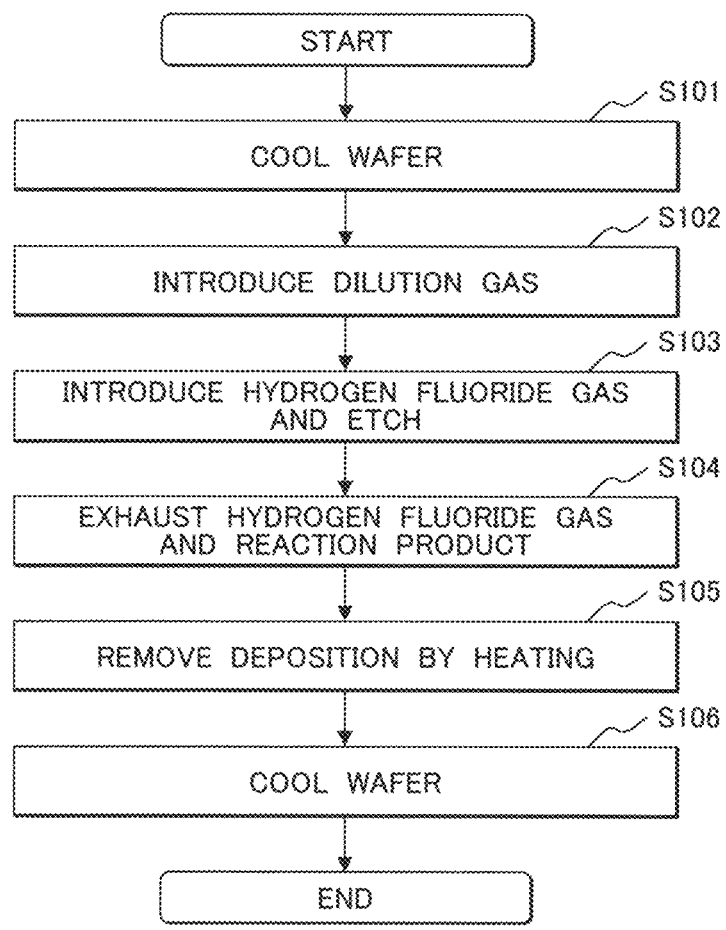
FIG. 5 is a time chart showing a flow of a modification of the etching process in the example shown in FIG. 2.

FIG. 5 is a flowchart showing a flow of a modification of the etching process in the example shown in FIG. 2. In FIG. 5, a process flow is shown in which Step S105 including a step of heating the wafer 2 and Step S106 including a step of cooling the wafer 2 are added subsequently to Steps S101 to S104 shown in FIG. 2.

FIG. 6 is a time chart showing an operation flow when the etching processing apparatus according to the example shown in FIG. 1 performs the etching processing according to the modification shown in FIG. 5. In FIGS. 5 and 6, the processes of Steps S101 to S104 are the same as those shown in FIG. 2. When the processes of Steps S101 to S104 meet the processing conditions of the wafer 2 that do not need to subsequently perform the step of heating the wafer 2, the heating and cooling steps (Steps S105 and S106) shown in the time chart of FIG. 6 may be omitted.

That is, as in the example of FIG. 2, the unprocessed wafer 2 is transported into the processing chamber 1, placed on the top surface of the wafer stage 3, and adsorbed and held on the top surface of the dielectric film on the top surface of the wafer stage 3, and then a heat conducting gas such as the He gas 55 is supplied to the gap between the back surface of the wafer 2 and the dielectric film to cool the wafer 2 (Step S101). Also, in the present modification, the temperature of the wafer 2 is maintained at a value within the range of −30° C. to −60° C., preferably −35° C. to −50° C.

Next, in Step S102, the Ar gas 52 for diluting the HF gas is supplied from above to the inside of the processing chamber 1. Then, in a state where the temperature of the wafer 2 is maintained in the range of −30° C. to −60° C., preferably −35° C. to −50° C., the HF gas is supplied to the processing chamber 1 at a predetermined flow rate for only a predetermined time, and the silicon oxide is removed by reaction of the supplied HF gas with the silicon oxide film of the wafer 2 surface, and etching is performed (Step S103).

After Step S103 is performed for the predetermined time, the supply of the HF gas into the processing chamber 1 is stopped, and the HF gas remaining in the gas phase in the processing chamber 1 or the reactive organism or particles of other gas formed in the processing chamber 1 are discharged to the outside of the processing chamber 1, the inner pressure of the processing chamber 101 is reduced, and then the supply of the He gas 55 supplied between the wafer 2 and the wafer stage 3 is stopped (Step S104). At the same time, the valve 54 is opened to set the pressure on the back surface of the wafer 2 to the same degree as the pressure in the processing chamber 1 (that is, the He gas 55 on the back surface of the wafer 2 is removed).

In the example of FIG. 6, the IR lamp unit 59 including the IR (infrared) lamps 60-1, 60-2, and 60-3 shown in FIG. 1 is used for heating the wafer 2 in Step S105. With the start of Step S105, the power from the lamp power supply 73 is supplied to the lamps 60-1, 60-2, and 60-3 in response to a command signal from an unillustrated controller, and the wafer 2 is irradiated with the electromagnetic waves including an infrared region. The steps of heating and cooling the wafer 2 described above may be performed after Steps S101 to S104 are repeated multiple times as a group until a predetermined amount of etching of the silicon oxide film 103 is obtained. Alternatively, the steps of heating and cooling the water 2 may be performed at least once every cycle as a part of a group of processes (cycle) performed following Steps S101 to S104.

The configuration for heating is not limited to the above example, and for example, a method of heating the wafer stage 3 or a method of separately transporting the wafer 2 to a device that performs only heating and performing the heat treatment may be used. Further, Ar gas or nitrogen gas can be introduced when irradiating the electromagnetic wave from the IR lamp unit 59. Further, heating for removing sediments and deposits may be performed multiple times as needed, and when the number of sediments and deposits is determined to fall within an allowable range, the heating and cooling Steps S105 and S106 described above may not be performed.

After the controller determines that the wafer 2 has been heated for a predetermined time or at a predetermined temperature in Step S105, the operation of the IR lamp unit 59 is stopped and Step S105 is completed. After that, Step S106 for cooling the wafer 2 is performed while the supply of the refrigerant having a predetermined temperature to the flow path 39 inside the wafer stage 3 and the supply of the He gas between the wafer 2 and the wafer stage 3 are maintained. After the cooling of the wafer 2 is continued until the detector detects the arrival of the predetermined time or the predetermine temperature, Step S106 is stopped, and the step of etching the silicon oxide film 103 of the wafer 2 is completed.

Further, as a post-processing for removing the deposits and residues after etching, heating in vacuum may be replaced with removal by washing with water. In addition, a cleaning process for removing the deposits on the surface by separation and volatilization with use of $O_2$ plasma can be used.

[Etching Result 1]

Figure 7A:
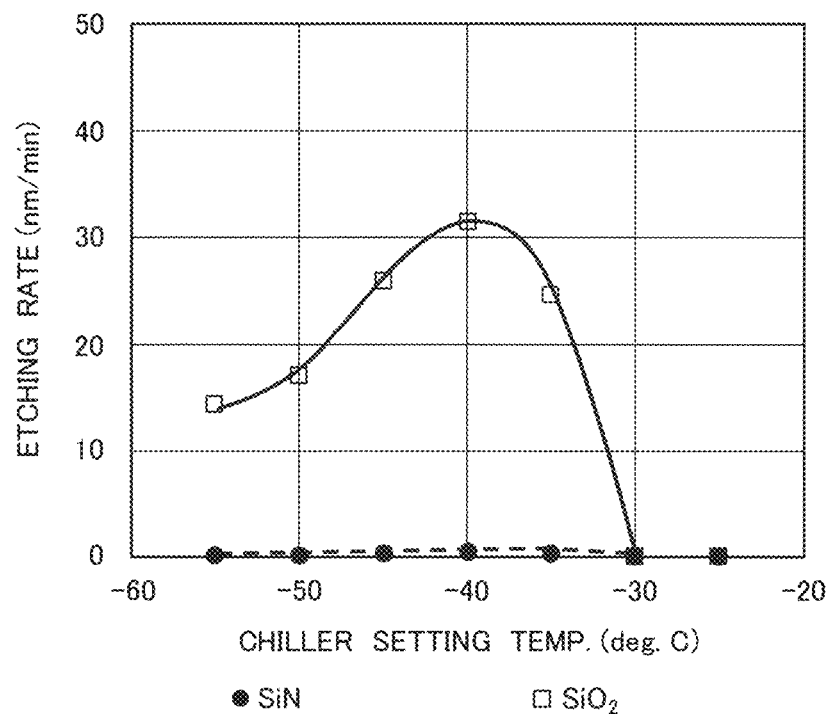
FIGS. 7A and 7B are graphs showing changes in etching rate and selectivity to a change in temperature of the wafer in the etching process according to the example shown in FIG. 2.
Figure 7B:
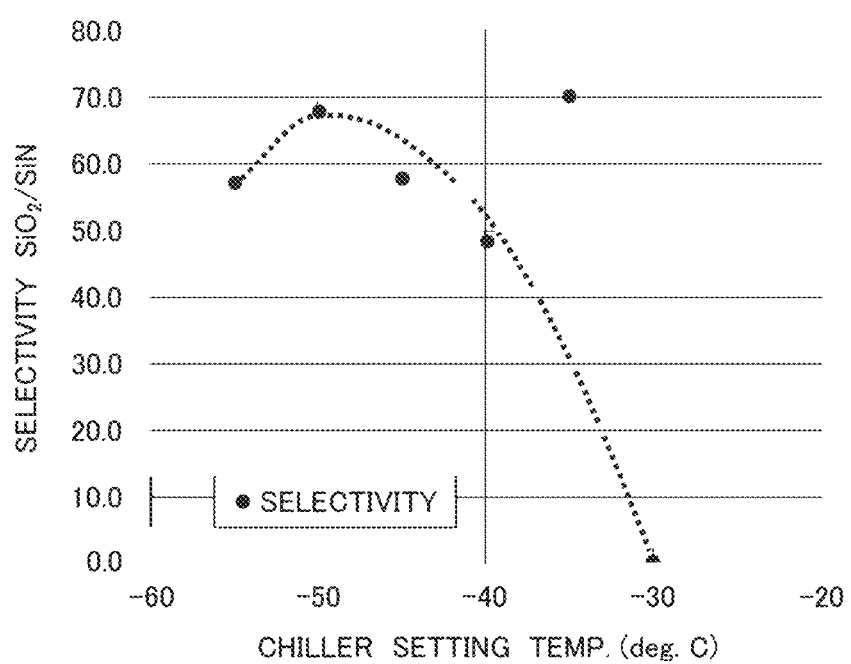

An example of the result of the etching process performed by using the steps shown in FIGS. 2 to 6 will be described with reference to FIGS. 7A and 7B. FIGS. 7A and 7B are graphs showing changes in the etching rate and selectivity with respect to changes in the temperature of the wafer in the etching process according to the example shown in FIG. 2. In FIGS. 7A and 7B, the results of measuring the etching rate of each single layer film of the silicon oxide film and the silicon nitride film formed by plasma CVD in each case where the temperature of the refrigerant supplied to the flow path 39 is changed in the range of −25° C. to −55° C. are indicated as points and lines.

In this example, a processing gas introduced into the processing chamber 1 in Step S103, which is a step of removing the silicon oxide film 103 by etching is a mixed gas in which 100 sccm of Ar as the dilution gas is added to 400 sccm of hydrogen fluoride. Further, a pressure in the processing chamber 1 during the process is set to 300 Pa, and an etching time is set to 120 s (sec, second).

Further, after completion of the etching process, after the evacuation is performed for 20 seconds in Step S104, in a state where setting the temperature of the refrigerant is maintained at that in the previous step, Ar is supplied into the processing chamber 1 at a flow rate of 500 sccm, and heated at a predetermine lamp intensity in a state where the opening degree of the pressure control valve 14 is 100% (fully open state) for 50 seconds. The maximum arrival temperature at that time is about 250° C. After that, the lamp is turned off, and Ar is cooled for 120 seconds while flowing for 500 sccm.

FIG. 7A shows the results of plotting the etching rates of the silicon oxide film and the silicon nitride film with a solid line and a dotted line with respect to the setting of the temperature of the refrigerant flowing in the flow path 39.

From FIG. 7A, when the set temperature of the refrigerant is higher than −30° C., etching does not occur in either the silicon oxide film 103 or the silicon nitride film 102. Further, it can be found that the etching rate of the silicon oxide film 103 rapidly increases under the condition of a temperature of −30° C. or lower. In the conditions of those processes, the etching rate of the silicon oxide film 103 is a value of 30 nm/min as the maximum value at −40° C. Furthermore, the etching rate tends to decrease at a lower temperature of −40° C. or lower.

On the other hand, the etching rate of the silicon nitride film is 1 nm/min or less in the range of −30° C. to −55° C., and it has been found that etching does not occur. Therefore, it has been found that the silicon oxide films are selectively etched with respect to the silicon nitride film in the range of −35° C. to −55° C. under the conditions used. FIG. 7B shows a graph of the etching rate of the silicon oxide film to the silicon nitride film as the selectivity with respect to the set temperature of the chiller. Although there are variations in points, it can be found that the selectivity is about 50 or more at −35° C. to −55° C.

From the above results, both the higher etching rate of the silicon oxide film and the lower etching rate of the silicon nitride film can be established, and it is desirable that the wafer temperature is −35° C. to −55° C. in order to etch the silicon oxide film with high precision at high selectivity as compared with the silicon nitride film. Since the etching rate of the silicon oxide film is high, the wafer temperature of −35° C. to −45° C. is more desirable.

Further, in the etching of the silicon oxide film 103 in this example, steps S101 to S106 shown in FIG. 5 can be repeated multiple times as a single process (cycle). In that case, the time chart of FIG. 6 is repeated a necessary number of times. For example, when the number of deposits is large, etching for a short time is repeated and removal by heating in vacuum are repeated so that the removal of the deposits becomes easier.

[Etching Result 2]

Figure 8A:
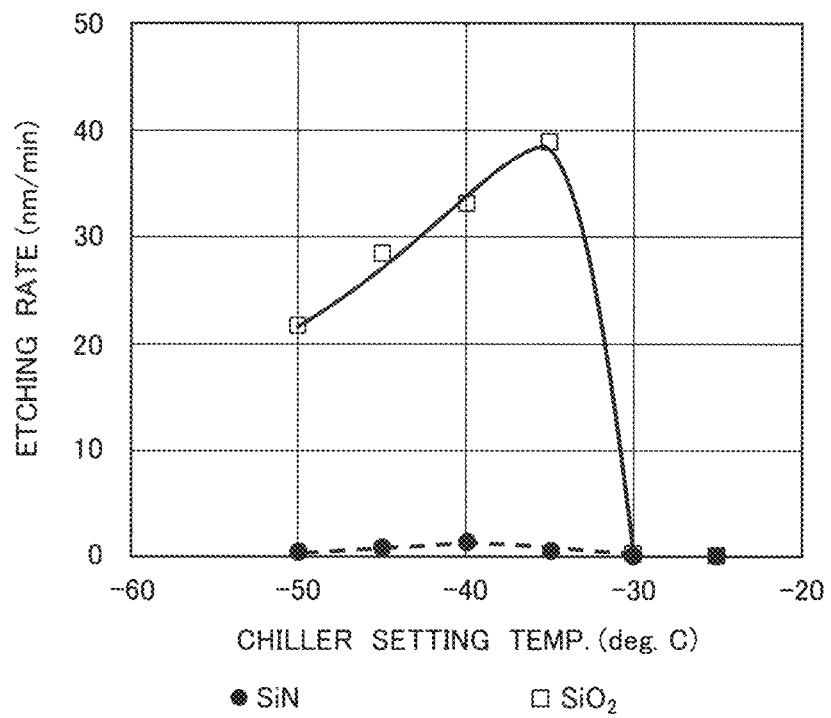
FIGS. 8A and 8B are graphs showing the result of performing the etching process according to another modification of the etching process shown in FIG. 2.
Figure 8B:
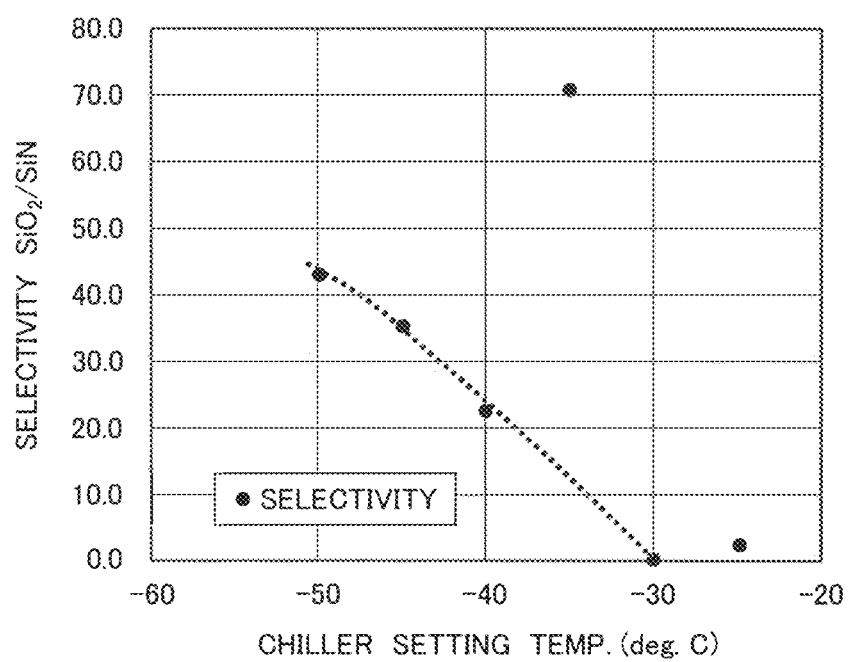

The results of etching by increasing the pressure in the conditions of the etching in the processing of the wafer 2 executed in the etching processing apparatus 100 described in the first embodiment or the modification will be described below with reference to FIGS. 8A and 8B as another modification. FIGS. 8A and 8B are graphs showing the results of carrying out the etching process according to another modification of the etching process shown in FIG. 2.

As in the first embodiment, the hydrogen fluoride gas is introduced into the processing chamber 1 without using plasma to etch the film structure in which the silicon oxide film and the silicon nitride film previously formed on the wafer 2 are laminated with a change in the temperature of the refrigerant to multiple values within the range of −25° C. to −55° C., and the results of the etching process at each temperature are detected. In this example, the processing gas used for the etching process is a mixed gas in which 100 sccm of Ar as a dilution gas is added to 400 sccm of hydrogen fluoride. The etching process is carried out in which Step S103 is performed for 120 seconds under the conditions that the pressure is 500 Pa and the others are the same with respect to the pressure of 300 Pa in the processing chamber 1 during the processing in the example or the modification shown in FIG. 2.

Further, after the step of etching the silicon oxide film 103 in Step S103 is completed and the supply of the hydrogen fluoride gas is stopped, the gas is exhausted for 20 seconds in Step S104, and then the temperature setting of the refrigerant is maintained in Step S105. While supplying Ar at 500 sccm into the processing chamber 1, predetermined power is supplied to the IR lamp unit 59 with the pressure control valve 14 open 100% (fully open), and the wafer 2 is irradiated with the electromagnetic ways from the lamps 60-1, 60-2, and 60-3, and heated for 50 seconds. The maximum temperature of the wafer 2 in Step S105 is about 250° C. After the irradiation of the electromagnetic waves of the lamps 60-1, 60-2, and 60-3 are stopped to complete Step S105, the wafer 2 is cooled for 120 seconds while Ar of 500 sccm is supplied into the processing chamber 1.

FIG. 8A shows the results of a change in the etching rates of the single layer films of the silicon oxide film and the silicon nitride film detected to a change in the set temperature of the refrigerant by a dotted line and a solid line.

Referring to FIG. 8A, it has been found that when the set temperature of the refrigerant flowing through the flow path 39 is higher than −30° C., etching does not occur in either the silicon oxide film or the silicon nitride film. It is also found that the etching rate of the silicon oxide film is suddenly increased when the temperature becomes −30° C. or lower. Under the used conditions, the etching rate of the silicon oxide film has a maximum value at −35° C., and shows 40 nm/min. Further, the etching rate tends to decrease when the temperature falls below −35° C.

Compared to the case in which the pressure in the processing chamber 1 during the etching process shown in FIG. 7A is 300 Pa, it is found that a solid-line profile indicating the etching rate of the silicon oxide film in the case of FIG. 8A processed at a pressure of 500 Pa is slightly shifted to the high temperature side.

As described above, in the present embodiment and the modification, it is considered that $HF_2^-$ becomes active species and etching occurs. As represented in Expression 1, it is considered that $HF_2^-$ is caused by a small amount of water present on the surface of the silicon oxide film. On the other hand, as represented by Expression 2, water is also a reaction product, and removal of water is indispensable for advancing the reaction.

In the above examples and modifications, the temperature of the wafer 2 or the wafer stage 3 supporting the wafer 2 is maintained at a value of −30° C. or lower during the etching process of the silicon oxide film. In this example, −35° C. is a melting point of a hydrofluoric acid aqueous solution having a concentration 50% close to that of the saturated solution, and on the surface of the silicon oxide film, the water generated by the reaction is mixed with the supplied hydrogen fluoride gas to produce hydrofluoric acid close to the saturated solution. When hydrofluoric acid becomes a solid, water is removed from the surface of the film structure of the wafer 2, and it is assumed that the etching process of the silicon oxide film progresses.

In the present modification, since the pressure in the processing chamber 1 during the processing is increased from 300 Pa to 500 Pa, the hydrofluoric acid becomes more likely to become a solid, and therefore it is conceivable that as shown in FIG. 8A, the graph shifts to the high temperature side. It is also considered that the above phenomenon contributes to the fact that the etching rate at −35° C. is higher than that in FIG. 7A.

On the other hand, the etching rate of the silicon nitride film is 2 nm/min or less in the range of −30° C. to −55° C., and it has been found that almost no etching occurs. Therefore, it has been found that the silicon oxide films are selectively etched with respect to the silicon nitride films in the range of −35° C. to −55° C. under the conditions used.

In FIG. 8B, the change in the ratio of the etching rate of the silicon oxide film to the silicon nitride film with respect to the change in the set temperature of the refrigerant are indicated by dots and a solid line. The ratio is considered to indicate the selectivity between those films. In FIG. 8B, although there are variations in dots, the selectivity is as high as 70 at −35° C. while the selectivity is about 20 to 50 at −40° C. to −55° C., and in this modification in which the pressure is raised to 500 Pa, it has been found that the selectivity is decreased slightly as a whole.

Incidentally, the present inventors have executed the process of Steps S101 to S106 shown in FIG. 5 with a change in the refrigerant under the pressure conditions of the present modification with respect to the wafer 2 providing the film structure having a laminated layer film of the silicon oxide film and the silicon nitride film shown in FIG. 3A. According to the study of the result of processing by the present inventors, some etching occurs at −30° C., but the etching amount is small. It has been found that a desired shape shown in FIG. 3B is obtained by etching at −35° C. to −50° C. Further, since heating is performed after etching, no residue or the like is observed on the processed surface, and the occurrence of deposits and irregularities is suppressed.

Second Embodiment

[Etching Processing Apparatus]

Figure 9:
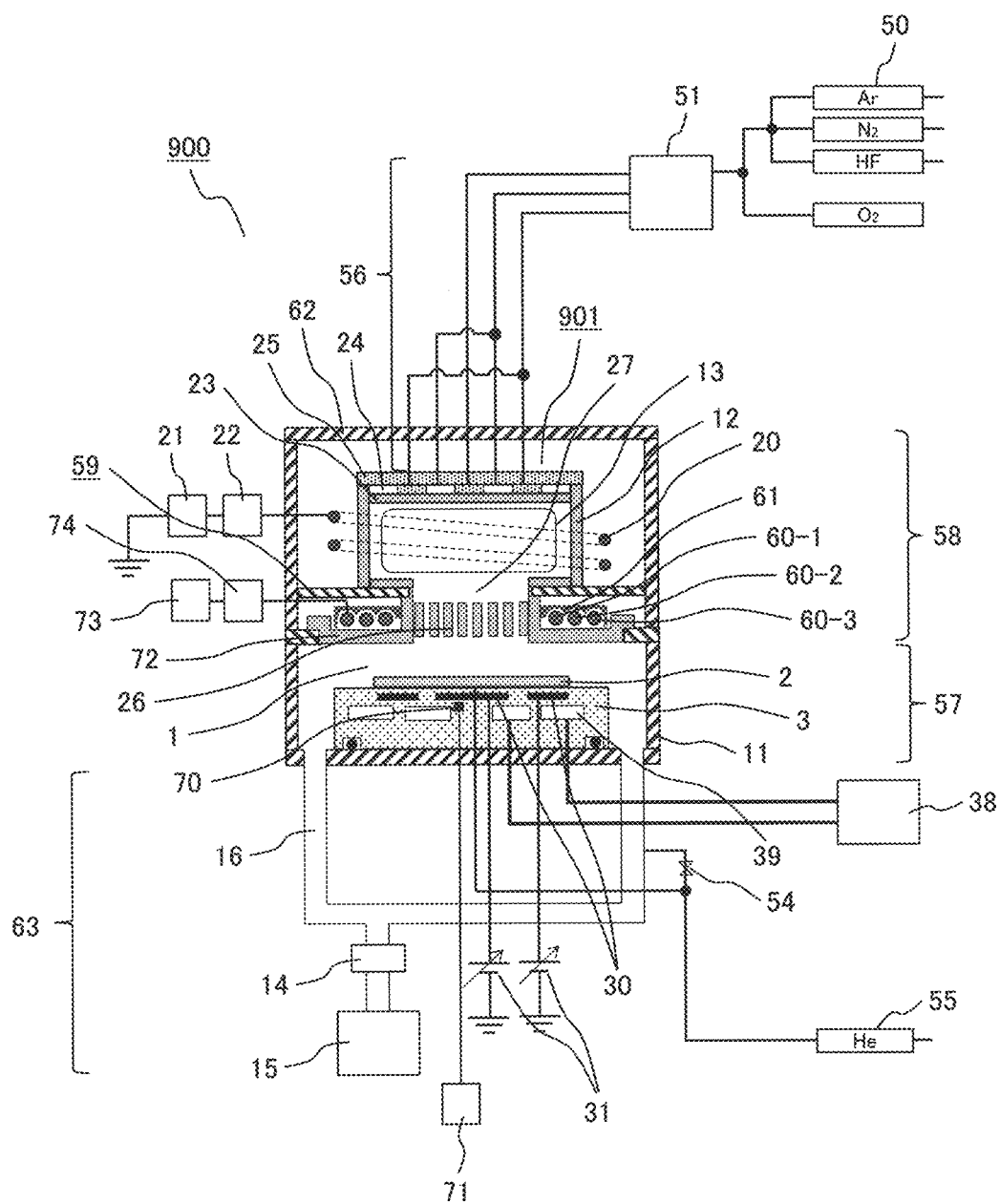
FIG. 9 is a vertical cross-sectional view schematically showing an outline of a structure of an etching processing apparatus according to another example of the present invention.

Next, an outline of the overall configuration of the etching processing apparatus according to a second embodiment of the present invention will be described with reference to FIG. 9. FIG. 9 is a vertical cross-sectional view schematically showing an outline of the configuration of an etching processing apparatus according to another example of the present invention.

A configuration difference of an etching processing apparatus 900 shown in FIG. 9 from the etching processing apparatus 100 in the example shown in FIG. 1 resides in that a plasma source 901 communicating with a processing chamber 1 through a flow path 27 having a cylindrical shape is disposed above a base chamber 11 into which the processing chamber 1 and a wafer stage 3 are incorporated. The plasma source 901 in this example is connected to the base chamber 11 so that a processing gas is supplied to a space in a quartz chamber 12 similarly configuring a vacuum chamber to generate plasma, and used for cleaning an inner wall of the vacuum chamber by highly reactive particles in the plasma and for generating highly reactive gas.

In the plasma source 901, a quartz chamber 12 made of a dielectric material such as quartz for forming an ICP (inductively coupled plasma) inside and having a cylindrical shape is disposed above the base chamber 11 with an IR lamp unit 59 interposed therebetween. Around an outer wall of the quartz chamber 12, an ICP coil 20, which is a coil for forming a high frequency electric field by receiving high frequency power for plasma formation, is disposed to be wound multiple stages in a vertical direction.

A high frequency power supply 21 is electrically connected to the ICP coil 20 through a matching machine 22. A frequency band of several tens of MHz is used as the frequency of high-frequency power, which is 13.56 MHz in this example. A disk-shaped top plate 25 is disposed above a sidewall upper end of the quartz chamber 12, and a seal such as an O-ring is sandwiched between the discharge chamber in the quartz chamber 12 and the circumference of the etching processing apparatus 900 so as to airtightly partition a cylindrical discharge chamber inside the quartz chamber 12 and atmosphere around the external etching processing apparatus 900, and those members are coupled to each other.

Gas supply pipes 56, which are multiple gas supply pipes through which a processing gas or an inert gas passes, are connected to the top plate 25. A gas dispersion plate 24 having a disk shape and having multiple through holes arranged in the vertical direction and a shower plate 23 below the gas dispersion plate 24 are disposed below the top plate 25. The processing gas and the inert gas supplied through the gas supply pipes 56 are dispersed through the through holes of the gas dispersion plate 24 and the shower plate 23, and are introduced into the quartz chamber 12 from above to below.

A supply flow rate of the gas is adjusted by a mass flow controller 50 installed for each gas type, as in the example of FIG. 1. Further, a gas distributor 51 is installed on a downstream side of the mass flow controller, and the flow rate and composition value of the gas supplied in the vicinity of the center of the quartz chamber 12 and the gas supplied in the vicinity of the outer periphery of the quartz chamber 12 can be adjusted independently, and the distribution of the partial pressure of each type of gas in the quartz chamber 12 is adjusted. In FIG. 9, Ar, $N_2$, HF, and $O_2$ are described as the gases supplied into the container, but other gases may be used if necessary.

The gas introduced into a space having a cylindrical shape enclosed by the quartz chamber 12 and the top plate 25 is excited by an induced electric field of a high frequency formed by an induced magnetic field formed by high frequency power supplied to the ICP coil 20, and ionization and dissociation occur to generate plasma. That is, the cylindrical space is a discharge chamber.

A cylindrical flow path 27 is disposed in the center of the IR lamp unit 59 below the discharge chamber, and communicates with an upper portion of the processing chamber 1 located further below. A slit plate 26, which is a disk made of a dielectric material such as quartz and having a permeability and providing multiple through holes in a vertical direction, is disposed inside the flow channel 27. The shape of the through holes may be rectangular, circular, or elliptical, and is not limited to the slit. The through holes of the slit plate 26 shield charged particles such as ions and electrons generated in the plasma formed in the discharge chamber, and allow particles of active species (radicals) and neutral gas to pass therethrough and enter the processing chamber 1 located below.

Further, the processing apparatus according to this example can heat the inside of a vacuum container other than the wafer stage 3 exposed to hydrogen fluoride gas such as a processing chamber. For example, the processing apparatus can maintain the wall surface of the base chamber 11 at a temperature between 40° C. and 120° C. As a result, particles and product gases such as hydrogen fluoride can be prevented from adsorbing onto the internal wall of the processing chamber 1, and the corrosion inside the chamber can be prevented.

[Etching Process]

The wafer 2 is etched in the same process as the one in the first embodiment with using the etching processing apparatus shown in FIG. 9. Since the etching processing apparatus 900 is equipped with the plasma source 902 of the ICP plasma, oxygen is introduced into the discharge chamber to form oxygen plasma before the start of the etching process of the wafer 2, and the inner wall of the processing chamber 1 or the discharge chamber is cleaned by charged particles or reactive particles formed by oxygen plasma.

As the conditions for the above cleaning step, the supply amount of oxygen ($O_2$) is 1000 sccm, a pressure in a discharge chamber or the processing chamber 1 is 50 Pa, and the high frequency power supplied to the ICP coil is 1500 W, and plasma for the above cleaning is formed for 300 seconds. In this step, foreign matter inside can be reduced.

Further, as a condition in Step S103 of the etching process, the set temperature of the refrigerant is set to −40° C., and hydrogen fluoride gas is introduced into the processing chamber through the discharge chamber without using plasma, and each single layer film of the silicon oxide films and the silicon nitride films formed on the wafer 2 in advance is etched. In this example, the gas used for etching is a mixed gas in which 600 sccm of hydrogen fluoride and 100 sccm of Ar are mixed with each other. The pressure in the processing chamber 1 during the etching process is maintained at 300 Pa, and etching is performed for 120 seconds.

Further, after the inside of the processing chamber 1 is exhausted for 30 seconds after the etching step is completed, the wafer 2 is carried out to the outside of the processing chamber 1 and the film thickness and the etching rate of each of the silicon oxide film and the silicon nitride film are detected. As a result, the etching rate of the silicon oxide film is 36 nm/min. On the other hand, the etching rate of the silicon nitride film is 0.9 nm/min, and the selectivity of etching the silicon oxide film to the silicon nitride film is 40.

Further, a film structure in which the silicon oxide films 103 and the silicon nitride films 102 are laminated on each other shown in FIG. 3A is etched using the etching process shown in FIG. 2. A process time of Step S103 at that time is 60 seconds. In this example, no heating is performed after etching, but no noticeable residue or the like is observed on the processed surface, and the surface is clean. As a result, it has been found that the silicon oxide films can be selectively etched with a shape close to a rectangle as shown in FIG. 3B.

Further, as another processing condition, the set temperature of the refrigerant is set to −45° C., and each of the single layer films of the silicon oxide films and the silicon nitride films on the wafer 2 is etched. As the gas used for etching in this example, a mixed gas in which 500 sccm of hydrogen fluoride and 100 sccm of $N_2$ are mixed with each other is used. The pressure in the processing chamber 1 during processing is 300 Pa, and etching is performed for 60 seconds.

Further, after exhausting for 30 seconds after etching, the wafer 2 is heated for 50 seconds with using the IR lamp unit 59. In that time, the maximum temperature of the wafer 2 is about 250° C. Then, the wafer 2 is cooled for 120 seconds. Furthermore, under the same conditions as above, hydrogen fluoride gas and $N_2$ are supplied, and the etching process and the heating process of the wafer 2 by the IR lamp unit 59 are repeated again.

Thereafter, the wafer 2 is carried out of the processing chamber 1 and the film thickness and the etching rate of each film layer are detected. As a result, the etching rate of the silicon oxide film is 32 nm/min. On the other hand, the etching rate of the silicon nitride film is 0.5 nm/min, and the selectivity of etching the silicon oxide film to the silicon nitride film is 64.

Further, under the same conditions, the film structure including the laminated films of the silicon oxide films 103 and the silicon nitride films 102 shown in FIG. 3A is etched using the etching process shown in FIG. 2. As a result, as shown in FIG. 3B, it has been found that the end of each film layer has a shape close to a rectangle and the silicon oxide films 103 are selectively etched. Further, the wafer 2 is heated after the etching process or the etching process is repeated twice, so that no residue or the like is observed on the processed surface of the film structure, and the number of deposits is reduced.

REFERENCE SIGNS LIST

1 . . . processing chamber
2 . . . wafer
3 . . . wafer stage
11 . . . base chamber
12 . . . quartz chamber
13 . . . discharge region
14 . . . pressure control valve
15 . . . exhaust device
16 . . . vacuum exhaust pipe
20 . . . ICP coil
21 . . . high frequency power supply
22 . . . matching machine
23 . . . shower plate
24 . . . gas dispersion plate
25 . . . top plate
26 . . . slit plate
27 . . . flow channel
30 . . . electrostatic adsorption electrode
31 . . . electrostatic adsorption DC power supply
38 . . . chiller
39 . . . flow path
50 . . . mass flow controller
51 . . . gas distributor
54 . . . valve
55 . . . He gas
59 . . . IR lamp unit
60-1, 60-2, 60-3 . . . lamp
61 . . . reflective plate
64 . . . power supply for lamp
70 . . . thermocouple
71 . . . thermocouple thermometer
72 . . . lamp power supply
73 . . . lamp power supply
74 . . . high frequency cut filter
101 . . . substrate
102 . . . silicon nitride film
103 . . . silicon oxide film
104 . . . opening

What is claimed is:

1. A dry etching method for etching a film structure without using plasma in which an end of a film layer having a silicon oxide film vertically sandwiched between silicon nitride films and laminated and formed in advance on a wafer disposed in a processing chamber forms a side wall of a groove or a hole while a processing gas is supplied into the processing chamber, the method comprising the steps of:
   supplying a hydrogen fluoride gas;
   cooling the wafer to a low temperature of −30° C. or lower, preferably, to −30 to −60° C.; and
   etching the silicon oxide film laterally from the end.

2. The etching method according to claim 1, wherein etching is performed at the temperature of the wafer of −35° C. or lower and −50° C. or higher.

3. The etching method according to claim 1, wherein the wafer is heated in a vacuum after etching.

4. The etching method according to claim 1, wherein a step of supplying the hydrogen fluoride gas to etch the wafer and a step of heating the wafer in a vacuum after etching are repeated a plurality of times.

5. The etching method according to claim 1, wherein an inert gas is further supplied in addition to the gas of the hydrogen fluoride.

6. The etching method according to claim 2, wherein the heating after the etching is lamp heating.

7. The etching method according to claim 2, wherein the wafer is heated in a vacuum after etching.

8. The etching method according to claim 2, wherein a step of supplying the hydrogen fluoride gas to etch the wafer and a step of heating the wafer in a vacuum after etching are repeated a plurality of times.

9. The etching method according to claim 2, wherein an inert gas is further supplied in addition to the gas of the hydrogen fluoride.

10. The etching method according to claim 3, wherein the heating after the etching is lamp heating.

11. The etching method according to claim 3, wherein a step of supplying the hydrogen fluoride gas to etch the wafer and a step of heating the wafer in a vacuum after etching are repeated a plurality of times.

12. The etching method according to claim 3, wherein an inert gas is further supplied in addition to the gas of the hydrogen fluoride.

13. The etching method according to claim 4, wherein the heating after the etching is lamp heating.

14. The etching method according to claim 4, wherein an inert gas is further supplied in addition to the gas of the hydrogen fluoride.

15. The etching method according to claim 5, wherein the heating after the etching is lamp heating.

\* \* \* \* \*